(12) United States Patent
Beer et al.

(10) Patent No.: US 10,796,985 B2
(45) Date of Patent: Oct. 6, 2020

(54) LEAD FRAME AND METHOD OF FABRICATING THE SAME

(71) Applicant: Danfoss Silicon Power GmbH, Flensburg (DE)

(72) Inventors: Holger Beer, Flensburg (DE); Lars Paulsen, Hollingstedt (DE)

(73) Assignee: Danfoss Silicon Power GmbH, Flensburg (DE)

( * ) Notice: Subject to any disclaimer, the term of this patent is extended or adjusted under 35 U.S.C. 154(b) by 0 days.

(21) Appl. No.: 15/628,794

(22) Filed: Jun. 21, 2017

(65) Prior Publication Data

US 2018/0012828 A1 Jan. 11, 2018

(30) Foreign Application Priority Data

Jul. 5, 2016 (DE) .......................... 10 2016 112 289

(51) Int. Cl.
*H01L 23/495* (2006.01)
*H01L 23/31* (2006.01)
*H01L 23/00* (2006.01)

(52) U.S. Cl.
CPC .... *H01L 23/49562* (2013.01); *H01L 23/3121* (2013.01); *H01L 23/49537* (2013.01); *H01L 23/49541* (2013.01); *H01L 23/49551* (2013.01); *H01L 23/49579* (2013.01); *H01L 24/45* (2013.01); *H01L 24/97* (2013.01); (Continued)

(58) Field of Classification Search
CPC ......... H01L 23/49579; H01L 23/49537; H01L 21/4821–4842; H01L 23/495–49596; H01L 23/3121; H01L 23/49531; H01L 23/49551; H01L 24/45; H01L 24/48; H01L 24/97; H01L 2924/0012; H01L 2924/0014; H01L 2924/181; H01L 2924/13055; H01L 2224/45014; H01L 2224/45099; H01L 2224/48247; H01L 23/49582;
(Continued)

(56) References Cited

U.S. PATENT DOCUMENTS 4,835,120 A * 5/1989 Mallik .............. H01L 23/49527
174/530
4,951,119 A 8/1990 Yonemochi et al.
(Continued)

FOREIGN PATENT DOCUMENTS

CN 101887876 A 11/2010
JP 2-78265 * 3/1990 ............. H01L 25/07
(Continued)

*Primary Examiner* — Mary A Wilczewski
(74) *Attorney, Agent, or Firm* — McCormick, Paulding & Huber PLLC

(57) ABSTRACT

A lead frame is provided, including one or more power terminals and one or more control terminals, wherein at least one of the control terminals is externally terminated with a press-fit contact member, and wherein at least one of the control terminals and at least one power terminals are formed from different materials. With the disclosed lead frame of the invention, lower material cross sections in the power terminals will be provided because of the better electrical conductivity when using pure copper compared to alloys with higher mechanical strengths. Also specific/different plating could be added to the individual needs of the different pin types without using masks in the plating process.

2 Claims, 8 Drawing Sheets

(52) U.S. Cl.
CPC .... *H01L 24/48* (2013.01); *H01L 2224/45014* (2013.01); *H01L 2224/48247* (2013.01); *H01L 2924/00014* (2013.01); *H01L 2924/13055* (2013.01); *H01L 2924/13091* (2013.01); *H01L 2924/181* (2013.01)

(58) Field of Classification Search
CPC ......... H01L 23/49541; H01L 23/49562; H01L 2924/00014; H01L 2924/13091
See application file for complete search history.

(56) References Cited

U.S. PATENT DOCUMENTS

| | | | | |
|---|---|---|---|---|
| 5,510,197 | A * | 4/1996 | Takahashi | B32B 15/018 257/666 |
| 5,530,284 | A * | 6/1996 | Bailey | H01L 23/49562 257/670 |
| 5,804,880 | A * | 9/1998 | Mathew | H05K 3/3442 257/779 |
| 6,072,228 | A | 6/2000 | Hinkle et al. | |
| 6,110,608 | A * | 8/2000 | Tanimoto | B32B 15/01 428/647 |
| 6,395,583 | B1 * | 5/2002 | Kubara | H01L 23/49582 257/666 |
| 6,545,342 | B1 * | 4/2003 | Abbott | H01L 23/49582 257/666 |
| 6,803,255 | B2 * | 10/2004 | Davis | H01L 21/4842 257/666 |
| 6,917,098 | B1 * | 7/2005 | Yamunan | H01L 23/4951 257/666 |
| 7,148,562 | B2 * | 12/2006 | Yoshida | H01L 23/36 257/675 |
| 7,977,775 | B2 * | 7/2011 | Yato | H01L 24/37 257/666 |
| 8,089,159 | B1 * | 1/2012 | Park | H01L 24/83 257/773 |
| 8,237,268 | B2 * | 8/2012 | Otremba | H01L 23/49582 257/734 |
| 8,274,307 | B1 * | 9/2012 | Ben Artsi | H01P 3/026 326/30 |
| 8,460,970 | B1 * | 6/2013 | Sirinorakul | H01L 23/4951 438/112 |
| 9,627,299 | B1 * | 4/2017 | Flessner | H01L 23/3157 |
| 9,859,195 | B1 * | 1/2018 | Shimizu | H01L 23/053 |
| 2001/0036514 | A1 * | 11/2001 | Iwamoto | C25D 5/022 427/471 |
| 2002/0088845 | A1 * | 7/2002 | Tanaka | C25D 3/60 228/254 |
| 2002/0104682 | A1 * | 8/2002 | Park | H01L 23/49582 174/255 |
| 2003/0011048 | A1 * | 1/2003 | Abbott | H01L 23/49582 257/666 |
| 2003/0082398 | A1 * | 5/2003 | Tanaka | B32B 15/01 428/647 |
| 2003/0137032 | A1 * | 7/2003 | Abbott | H01L 23/49582 257/666 |
| 2003/0193791 | A1 * | 10/2003 | Panella | H01L 23/49805 361/764 |
| 2005/0012183 | A1 | 1/2005 | Chow et al. | |
| 2007/0252265 | A1 * | 11/2007 | Sander | H01L 23/49575 257/691 |
| 2009/0189264 | A1 * | 7/2009 | Yato | H01L 23/49513 257/676 |
| 2009/0261461 | A1 * | 10/2009 | Sapp | H01L 23/49524 257/666 |
| 2010/0308448 | A1 * | 12/2010 | Murakami | H01L 21/4821 257/676 |
| 2011/0096495 | A1 * | 4/2011 | Heise | H05K 1/0263 361/688 |
| 2011/0097854 | A1 * | 4/2011 | Fujishima | H01L 21/4835 438/123 |
| 2011/0127888 | A1 * | 6/2011 | Tunzini | H01L 24/49 310/68 D |
| 2011/0272768 | A1 * | 11/2011 | Nakamura | G01L 19/0084 257/414 |
| 2012/0025375 | A1 * | 2/2012 | Lam | H01L 21/4832 257/738 |
| 2012/0038064 | A1 * | 2/2012 | Camacho | H01L 24/29 257/777 |
| 2013/0037927 | A1 * | 2/2013 | Rogren | H01L 23/49541 257/676 |
| 2013/0062742 | A1 * | 3/2013 | Warren | H01L 23/49582 257/666 |
| 2013/0105956 | A1 | 5/2013 | Jo et al. | |
| 2013/0133193 | A1 * | 5/2013 | Hsu | H01L 23/49503 29/840 |
| 2013/0207252 | A1 * | 8/2013 | Muto | H01L 24/84 257/676 |
| 2014/0124912 | A1 * | 5/2014 | Kaneda | H01L 24/49 257/676 |
| 2014/0284784 | A1 * | 9/2014 | Yasunaga | H01L 24/85 257/690 |
| 2015/0270203 | A1 * | 9/2015 | Nishiuchi | H01L 21/4803 257/675 |
| 2015/0348891 | A1 | 12/2015 | Talledo | |
| 2016/0126205 | A1 * | 5/2016 | Kadoguchi | H01L 23/3107 257/736 |
| 2016/0233151 | A1 * | 8/2016 | Ichikawa | H01L 25/115 |
| 2016/0307854 | A1 * | 10/2016 | Matsubara | H01L 23/49503 |
| 2016/0315037 | A1 * | 10/2016 | Kadoguchi | H01L 23/49562 |
| 2016/0343630 | A1 * | 11/2016 | Kadoguchi | H01L 23/051 |
| 2017/0025331 | A1 * | 1/2017 | Kamiyama | H01L 23/49811 |
| 2017/0040246 | A1 * | 2/2017 | Shuto | H01L 23/49541 |
| 2017/0162482 | A1 * | 6/2017 | Kadoguchi | H01L 24/40 |
| 2017/0229382 | A1 * | 8/2017 | Yasunaga | H01L 23/367 |
| 2017/0309580 | A1 * | 10/2017 | Pola | H01L 24/37 |
| 2018/0012822 | A1 * | 1/2018 | Lohtander | H01L 23/10 |
| 2018/0012828 | A1 * | 1/2018 | Beer | H01L 23/49537 |
| 2018/0047588 | A1 * | 2/2018 | Rogren | H01L 21/4821 |
| 2018/0109249 | A1 * | 4/2018 | Suh | H01L 23/49575 |
| 2018/0358287 | A1 * | 12/2018 | Wong | H01L 21/4825 |
| 2019/0214749 | A1 * | 7/2019 | Chang | H01L 23/49555 |
| 2019/0221504 | A1 * | 7/2019 | Nishiyama | H01L 23/49555 |
| 2020/0035580 | A1 * | 1/2020 | Hoegerl | H01L 23/367 |
| 2020/0035616 | A1 * | 1/2020 | Hoegerl | H01L 21/565 |

FOREIGN PATENT DOCUMENTS

| | | |
|---|---|---|
| JP | H05-299576 A | 11/1993 |
| KR | 2011-0092779 A | 8/2011 |

* cited by examiner

LEAD FRAME AND METHOD OF FABRICATING THE SAME

CROSS-REFERENCE TO RELATED APPLICATION

This application claims foreign priority benefits under U.S.C. § 119 to German Patent Application No. DE102016112289.0 filed on Jul. 5, 2016, the content of which is hereby incorporated by reference in its entirety.

TECHNICAL FIELD

Embodiments of the present invention generally relate to the technical field of circuit package; and more particularly, to a lead frame for package of electrical power module, and to associated method of fabricating the same.

BACKGROUND ART

In the prior art, the use of a lead frame in constructing a semiconductor power module is well known. The external contacts required in a finished module are initially stamped from a single sheet of metal. This structure is the lead frame. All the contacts leads are present and connected together to provide a single structure for convenient handling and placement. The lead frame is placed on a substrate of a power module and connections are in turn made by a semiconductor device interconnection method, such as soldering, sintering, ultrasonic welding, and so on. Before or after such step the substrate may also be populated with electronic components for constituting the power module, such as switching semiconductors (e.g., IGBTs, MOSFETs), passive electronic components including resistors, diodes, capacitors or inductors, and interconnections (e.g., as wire-bonds). Then the substrate, the electronic components and the lead frames may be encapsulated in an integral circuit package with some of the lead frame material being removed to leave the leads separated, e.g., by a cutting/trimming process.

In a typical current-switching power module, there may be two types of connections: i.e., power leads for carrying high currents into and out of the module; and control leads for carrying low-level control signals, for example, to control the functions of input, output and switchover of the circuit within the module. An increasingly popular known method of connecting the control leads to other circuits within same electronic equipment which comprises the power module, is by the use of press-fit connectors/terminals. Press-fit terminals are typically shaped at the ends of the control leads to form as individual compliant pin sections with elasticity which allow for being pushed tightly into and sustaining a permanent contact normal force with corresponding plated through holes (PTH), due to respective deformations of the compliant pin sections during insertion, so as to ensure a reliable electrical and mechanical connection over lifetime; however, such press-fit technology is only suitable for low-current applications such as passing control signals, rather than for high-current applications e.g., the power connections. In order to maximize the utility of a lead frame in carrying both power supply current and low-level control signal simultaneously, a plurality of control leads with elastic/compliant press-fit pins and a plurality of power leads with high current-carrying capability are combined into one and the same integral lead frame; and since only one lead frame of one material is usually used in a molded module, then, such integral lead frame is formed e.g., by using a conductive material having elasticity. By way of example, a lead frame module including both press-fit control leads and non press-fit power leads is shown in an earlier Korean patent application document KR20110092779.

However, if a single lead frame formed by only one material is to be used, then a compromise has to be reached, leading to power leads that have a greater than optimum electrical resistance and press-fit leads which do not have optimum characteristics, due to different requirements of the power and control leads. To be specific, it is an advantage if the power leads have low electrical resistance and thus a high electrical conductivity to conduct currents up to several hundred amps; hereby, such power leads are typically made of pure copper. However, in contrast, the control leads with press-fit connectors need to be made from a material that has a certain amount of elasticity (high tensile strength), and pure copper is less suitable than other alloys. For example, a typical press-fit type pin needs to be formed by a copper alloy with high mechanical strength and also with a much lower electrical conductivity than pure copper. This pin type is usually used for auxiliary functions. The lower electrical conductivity of such single elastic material would lead to higher material cross sections for the power terminals, and in turn a thicker or wider terminal geometries, which needs space in the module and adds part cost accordingly.

In conclusion, on one hand, if a single lead frame is to be formed by one single metallic material, then the requirement for the material is demanding in both high electrical conductivity and good elasticity.

On the other hand, press fit type pins cannot be provided if high electrical conductivity is the leading requirement.

In addition, it is sometimes advantageous to plate some contacts in a particular way. For example, press-fit connectors can be applied with a nickel/tin (NiSn) plating, but this is a complex process if a masking is required to prevent the plating covering the power connectors.

In order to combine both press-fit pins as control terminals and power terminals with high current carrying capability into one single mold module as an integral lead frame, it is advantageous to use different materials for each pin type. The use of different materials for different pin types helps to tailor the properties like high tensile strength for the press-fit type and high current carrying capability for the power terminals. Therefore, it may be advantageous to develop a lead frame with power leads of one highly conductive material and press-fit control leads of another elastic conductive material. In particular, such lead frame may be obtained by combining at least two sub-lead frames of different materials, so that only one assembly lead frame has to be processed finally the same as previous lead frame in the prior art, while maintaining existing molding, trimming and forming processes.

SUMMARY

The present invention has been made to overcome or alleviate at least one aspect of the above mentioned disadvantages and/or shortcomings existing in the conventional technical solutions.

Accordingly, it is a major object of the exemplary embodiment of the present invention to provide a lead frame that leads to lower material cross sections in the power terminals because of the better electrical conductivity when using pure copper compared to alloys with higher mechanical strengths. Also specific/different plating could be added to the individual needs of the different pin types without using masks in the plating process.

According to an aspect of the exemplary embodiment of the present invention, there is provided a lead frame, comprising one or more power terminals and one or more control terminals, and at least one of the control terminals is externally terminated with a press-fit contact member, while at least one of the control terminals and at least one power terminals are formed from different materials.

According to another exemplary embodiment of the present invention, the lead frame comprises at least one power sub lead frame which is formed by a first material with high current conductivity and at least one control sub lead frame which is formed by a second material with elasticity for making press-fit type terminals thereof, and at least one power sub lead frame and at least one control sub lead frame are combined together at a bimetallic interface.

According to another exemplary embodiment of the present invention, the power sub lead frame and the control sub lead frame which abut each other are bonded together at the bimetallic interface.

According to another exemplary embodiment of the present invention, the power sub lead frame and the control sub lead frame are bonded together by any one chosen from a group comprising laser welding, ultrasonic welding, cladding, or use of epoxy resins.

According to another exemplary embodiment of the present invention, one of the sub lead frames is formed to be provided with a pocket at the ends for receiving full profile of corresponding portion of the other sub lead frame.

According to another exemplary embodiment of the present invention, the power sub lead frame and the control sub lead frame are bonded together by any one chosen from a group comprising laser welding, ultrasonic welding, cladding, or use of epoxy resins.

According to another exemplary embodiment of the present invention, edges of the power sub lead frame and the control sub lead frame at the bimetallic interface are formed to be complementarily profiled along the bimetallic interface, by having respective concave/convex portions which are complement in shape.

According to another exemplary embodiment of the present invention, the power sub lead frame and the control sub lead frame are bonded together by any one chosen from a group comprising laser welding, ultrasonic welding, cladding, or use of epoxy resins.

According to another exemplary embodiment of the present invention, one of the sub lead frames is formed to be provided with a pocket at the ends for receiving full profile of corresponding portion of the other sub lead frame, along all of the complementarily profiled edges of the power sub lead frame and the control sub lead frame.

According to another exemplary embodiment of the present invention, the power sub lead frame and the control sub lead frame are bonded together by any one chosen from a group comprising laser welding, ultrasonic welding, cladding, or use of epoxy resins.

According to another exemplary embodiment of the present invention, the thickness of the first and second materials is essentially the same.

According to another aspect of the exemplary embodiment of the present invention, there is further provided with a method for fabricating a lead frame, comprising steps of: manufacturing a control sub lead frame and a power sub lead frame individually and separately; forming one or more power terminals within the power sub lead frame and one or more control terminals within the control sub lead frame, individually; terminating at least one of the control terminals externally with a press-fit contact member; and abutting, fitting and bonding the two sub lead frames together to form a secured bimetallic interface therebetween so as to form an integral lead frame, and at least one of the control terminals and at least one power terminals are formed from different materials.

According to an exemplary embodiment of the present invention, the step of forming terminals further comprises: terminating at least one of the control terminals internally with a control contact member; and terminating at least one of the power terminals internally with a power contact member.

According to an exemplary embodiment of the present invention, the step of manufacturing the two sub lead frames comprises providing a pocket at an end thereof along the bimetallic interface for receiving full profile of corresponding portion of the other sub lead frame.

According to an exemplary embodiment of the present invention, the step of manufacturing the two sub lead frames comprises forming edges of the power sub lead frame and the control sub lead frame at the bimetallic interface to be complementarily profiled along the bimetallic interface, by having respective concave/convex portions which are complement in shape.

According to an exemplary embodiment of the present invention, the step of abutting, fitting and bonding the two sub lead frames together comprises bonding by any one chosen from a group comprising laser welding, ultrasonic welding, cladding, or use of epoxy resins.

According to another exemplary embodiment of the present invention, the lead frame comprises a power sub lead frame which is formed by a first material with high current conductivity and a control sub lead frame which is formed by a second material with elasticity for making press-fit type terminals thereof, and the power sub lead frame and the control sub lead frame are combined together at a bimetallic interface.

According to another exemplary embodiment of the present invention, the thickness of the first and second materials is essentially the same.

In conclusion, in the solution exemplary embodiments of the present invention, a novel and advantageous lead-frame, a package of a power module comprising the lead-frame and a method for fabricating the same are provided by using different materials for each pin type, having some advantageous technical effects, as below: firstly, the use of different materials for different pin types helps to tailor the properties like high tensile strength for the press-fit type signal terminals or control terminals and high current carrying capability and electrical conductivity property for the power terminals, therefore the lead-frame material may not necessarily be any one specific alloy material which has to make compromise between electrical resistance and mechanical strength. Secondly, in the power terminals, low material cross sections can be realized because of the better electrical conductivity as compared with alloys with higher mechanical strengths; meanwhile, a minimized dimensional difference between the power terminals and the control or signal terminals may advantageously balance between the power terminals and the control or signal terminals the distribution of not only internal stresses but also any external forces applied thereon, respectively. Thirdly, several different plating processes could also be incorporated during fabrication of a lead-frame as a function of the individual needs of the different pin types, without the need of masks in the plating process. Finally, since such lead-frame can be achieved e.g. by combining at least two or more sub-lead frames to one part so that only one assembled lead frame has to be processed same as parts made of prior art, hereby, an advantage of this can be obtained such that the molding, trimming, and pin-forming processes still remain the same as that of the conventional lead-frame processing.

BRIEF DESCRIPTION OF THE DRAWINGS

These and/or other aspects and advantages of the invention will become apparent and more readily appreciated from the following description of the embodiments, taken in conjunction with the accompanying drawings of which.

Figure 1:
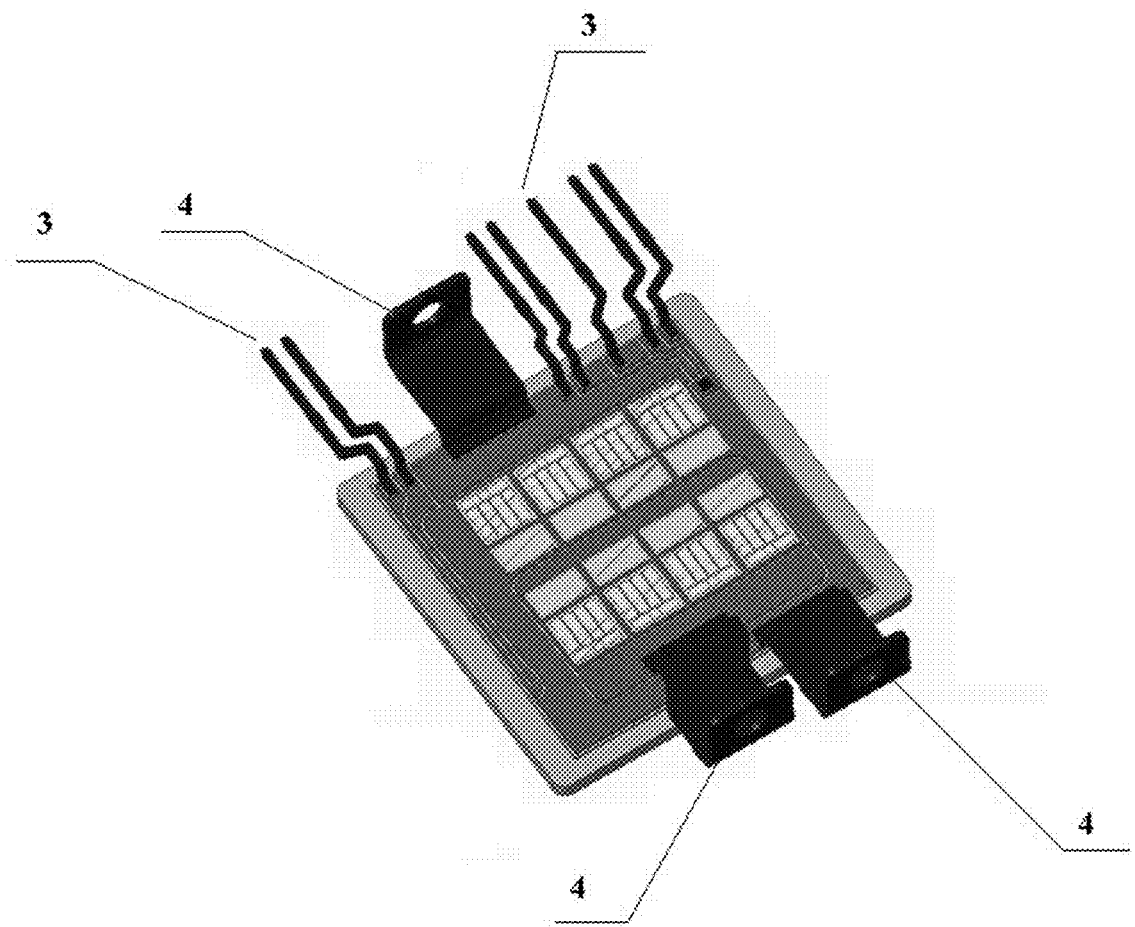
FIG. 1 is a schematic perspective view illustrating a final product of power electronic device including a lead frame with power pins and auxiliary pins extending therefrom, in the prior art.

The scope of the present invention will in no way be limited to the simply schematic views of the drawings, the number of constituting components, the materials thereof, the shapes thereof, the relative arrangement thereof, etc., and are disclosed simply as an example of an embodiment.

DETAILED DESCRIPTION

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the invention in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each components/members in the drawings are only intended to exemplarily illustrate the contents of the disclosure, rather than to demonstrate the practical dimension or proportion of components of the sealing arrangement solution.

Figure 2:
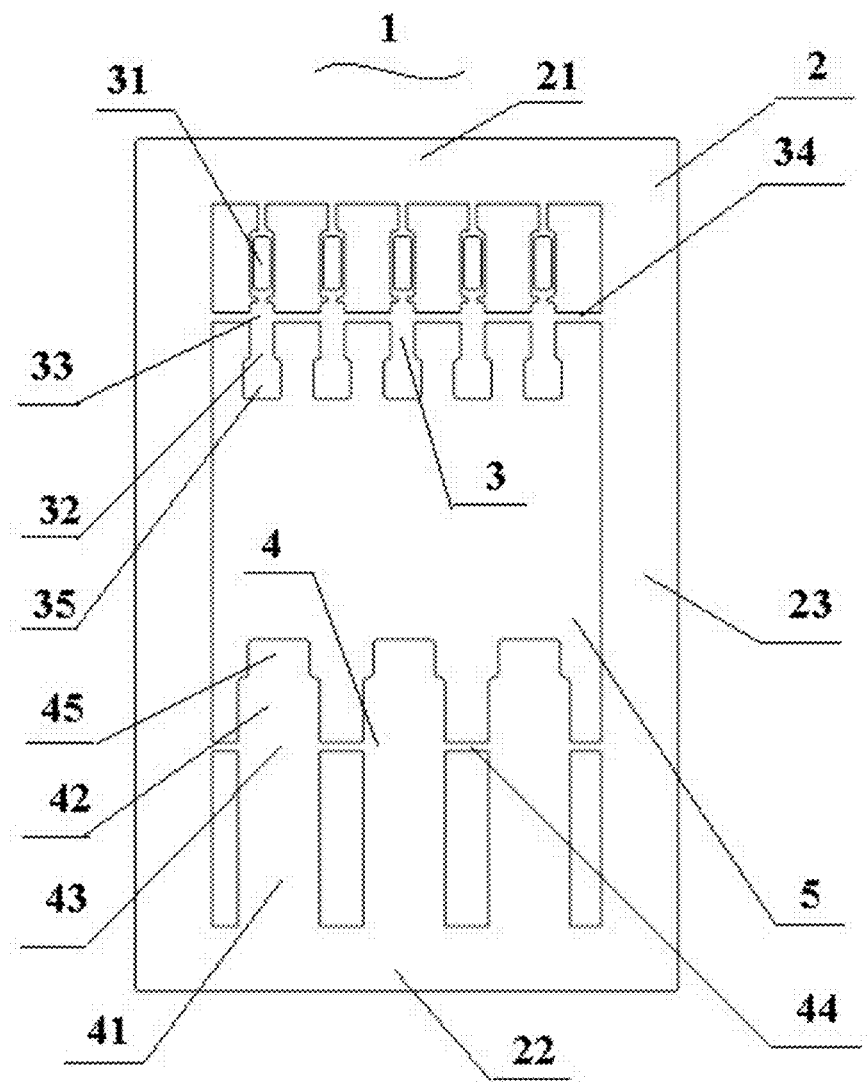
FIG. 2 is a schematic top view of a conventional lead frame in the prior art, before placing onto a substrate of a power electronic device.

FIG. 1 is a schematic perspective view illustrating a final product of power electronic device including a lead frame with power pins and auxiliary pins extending therefrom, in the prior art; and FIG. 2 is a schematic top view of a conventional lead frame in the prior art, before placing onto a substrate of a power electronic device.

In the prior art, a lead frame is widely used in the power electronics, as illustrated in FIG. 1. To be specific, by way of example, as illustrated in FIG. 2, a conventional lead frame 1 for semiconductor chip is provided, comprising an outer supporting frame 2, a plurality of control leads 3 and a plurality of power leads 4.

The outer supporting frame 2 is formed to be a hollow metal sheet, comprising: a control-side beam 21 from which the plurality of control leads 3 extend inwards; a power-side beam 22 from which the plurality of power leads 4 extend inwards, the control-side beam being parallel to the power-side beam and aligned therewith at both ends; and a pair of lateral beams 23 each of which are interposed between corresponding aligned ends of the control-side beam 21 and the power-side beam 22, such that the outer supporting frame 4 is formed in a rectangular pattern with a central rectangular cavity 5 for accommodating a semiconductor therein.

The plurality of control leads 3 are arranged to be in parallel with and spaced apart from one another, extending perpendicular to the control-side beam 21, and each of the plurality of control leads 3 comprises a first outer lead section 31 and a first inner lead section 32 aligned in line and joined together at a first central joint 33, with all of the first central joints being coupled by a first supporting bar 34 stretching laterally across the pair of lateral beams 23 so as to secure in place the plurality of control leads relative to the lead frame before a trimming process thereof which follows a attaching/bonding process of a semiconductor chip onto the lead frame.

Likewise, the plurality of power leads 4 are arranged to be in parallel with and spaced apart from one another, extending perpendicular to the power-side beam 22, and each of the plurality of power leads 4 comprises a second outer lead section 41 and a second inner lead section 42 aligned in line and joined together at a second central joint 43, with all of the second central joints being coupled by a second supporting bar 44 stretching laterally across the pair of lateral beams 23 so as to secure in place the plurality of power leads relative to the lead frame before a trimming process thereof which follows a attaching/bonding process of a semiconductor chip onto the lead frame.

Each of the first outer lead sections 31 is positioned between the control-side beam 21 and corresponding first central joint 33, while each of the first inner lead sections 32 extends inwards of the lead frame 1 from the corresponding first central joint 33 and terminates at a free inner control terminal 35. And each of the second outer lead sections 41 is positioned between the power-side beam 22 and corresponding second central joint 43, while each of the second inner lead sections 42 extends inwards of the lead frame 1 from the corresponding second central joint 43 and terminates at a free inner power terminal 45. And the semiconductor chip, which is to be attached onto and bonded to the lead frame 1, is configured to be directly attached to the free inner control terminals 35 of the first inner lead sections 32 and the free inner power terminals 45 of the second inner lead sections 42 of the lead frame 1.

As aforementioned, if a single lead frame formed by only one material is to be used, then a compromise should be reached, leading to power leads that have a greater than optimum resistance and press-fit leads which do not have optimum characteristics, due to different requirements of the power and control leads.

In order to combine both elastic press-fit pins as control terminals and power terminals with high current carrying capability into one single mold module as an integral lead frame, it is advantageous to use different materials for each pin type, since the use of different materials for different pin types helps to tailor the properties like high tensile strength for the press-fit type and high current carrying capability for the power terminals. Therefore, for example, it may be advantageous to develop a lead frame with power leads of one highly conductive material and press-fit control leads of another elastic conductive material, so that only one assembly lead frame has to be processed finally in a same manner as that used for previous lead frame in the prior art, while maintaining existing molding, trimming and forming processes.

Fundamental Embodiment

Figure 3:
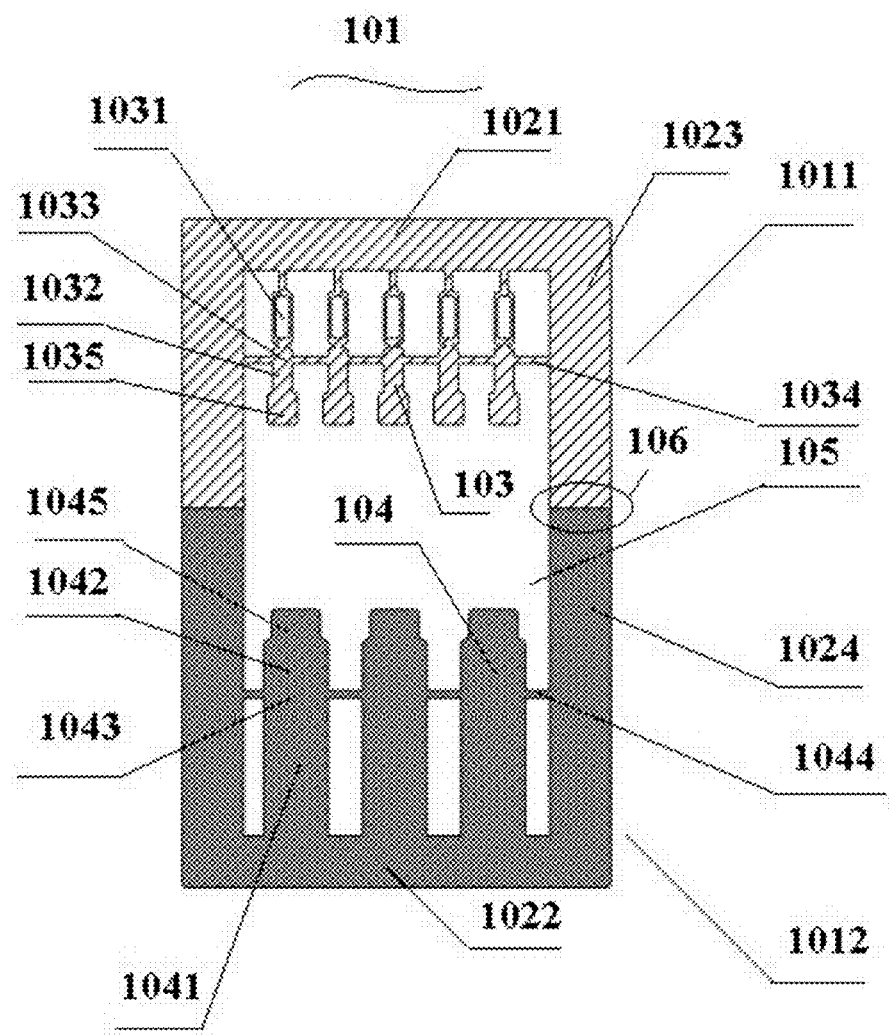
FIG. 3 is a schematic top view of an exemplary lead frame with a power sub lead frame and a control sub lead frame which are formed by different metallic materials in an exemplary embodiment of the invention, before placing onto a substrate of a power electronic device.

FIG. 3 is a schematic top view of an exemplary lead frame with a power sub lead frame and a control sub lead frame which are formed by different metallic materials in an exemplary embodiment of the invention, before placing onto a substrate of a power electronic device; and FIG. 4(a)-4(e) are schematic top views illustrating the method of attaching a semiconductor chip onto a substrate while forming individual final power terminals and control terminals, by using the exemplary lead frame in FIG. 3. The substrate 2022 may typically be formed from a direct copper bond (DCB) structure where a ceramic inner plate is covered with a copper layer on both sides. When used in a power module such as in the current invention, one of the copper layers may be used for the mounting of electrical components (and the lead frame), and this copper layer may be patterned to give track areas electrically insulated from other track areas.

According to a general technical concept of the present invention, in an exemplary embodiment of the invention, there is provided a lead frame 101, as illustrated in FIG. 3, comprising one or more control terminals 103 and one or more power terminals 104, at least one of the control terminals 103 being externally terminated with a press-fit contact member 1031, and at least one of the control terminals 103 and at least one power terminals 104 being formed from different materials.

As an exemplary embodiment, to be specific, as illustrated in FIG. 3, the lead frame 101 of the present application comprises a control sub lead frame 1011 for carrying control signals and a higher capacity power sub lead frame 1012 for carrying the main or rated current. By way of example, the control sub lead frame 1011 and the power sub lead frame 1012 are individually manufactured and subsequently terminated or joined together during manufacturing so as to form an integral lead frame 101. For example, either one of the control sub lead frame and the power sub lead frame may be firstly stamped, and then processed by a series of optional steps including bending, drawing, forming or other metal-working processes to form their respective final patterns individually.

Moreover, in an exemplary embodiment of the invention, a material of the control sub lead frame 1011 is different from that of the power sub lead frame 1012. For example, the control sub lead frame 1011 may be formed by a conductive material with certain elasticity for facilitating press-fit terminals for carrying low-level control signals; and the power sub lead frame 1012 may be formed by a conductive metallic material with lower resistance and thus high current carrying capability. By way of example, the power leads with power connection terminals are preferably made from pure copper, or alternatively its alloy with similar optimum conductive properties, e.g., Wieland K12 Copper Cu-HCP, or K14 Cu-PHC which may be commercially available from Wieland Metals Inc.; while the control leads with press-fit terminals are preferably made from a material has a certain amount of elasticity, i.e., high tensile strength, as compared with pure copper, e.g., a high performance alloy K55 or B16 (phosphor bronze) which is commercially available from Wieland Metals Inc. Note that stating a component is made of a metal material essentially includes components made from pure metal or from alloys of such metal materials).

To be specific, by way of example, as shown in FIG. 3, the control sub lead frame 1011 comprises a control-side beam 1021, a pairs of lateral beams 1023 which extend inwards the lead frame 101 at both ends of the control-side beam 1021, and a plurality of control terminals 103 which extend inwards from and perpendicular to the control-side beam 1021. Likewise, the power sub lead frame 1012 comprises a power-side beam 1022, a pairs of lateral beams 1024 which extend inwards the lead frame 101 at both ends of the power-side beam 1022, and a plurality of power terminals 104 which extend inwards from and perpendicular to the power-side beam 1022. All the beams 1021, 1023 of the control sub lead frame 1011, and all the beams 1022, 1024, are coordinately formed as a pattern of a hollow rectangular metal sheet of two metallic materials, with a central rectangular cavity 105 for accommodating a semiconductor therein.

Here, in an exemplary embodiment of the invention, as illustrated in FIG. 3 in details, the plurality of control terminals 103 are arranged to be in parallel with and spaced apart from one another, and each of the plurality of control terminals 103 comprises a first outer lead section 1031 and a first inner lead section 1032 aligned in line and joined together at a first central joint 1033, with all of the first central joints 1033 being coupled crosswise by a first supporting bar 1034 stretching laterally across the pair of lateral beams 1023 so as to secure in place the plurality of control terminals 103 relative to the lead frame 101 before a trimming process thereof which follows a attaching/bonding process of a semiconductor chip onto the lead frame.

Likewise, by way of example, as also illustrated in FIG. 3 in details, the plurality of power terminals 104 are arranged to be in parallel with and spaced apart from one another, and each of the plurality of power terminals 104 comprises a second outer lead section 1041 and a second inner lead section 1042 aligned in line and joined together at a second central joint 1043, with all of the second central joints 1043 being coupled crosswise by a second supporting bar 1044 stretching laterally across the pair of lateral beams 23 so as to secure in place the plurality of power terminals 104 relative to the lead frame 101 before a trimming process thereof which follows a attaching/bonding process of a semiconductor chip onto the lead frame.

In an exemplary embodiment of the invention, each of the first outer lead sections 1031 is positioned between the control-side beam 1021 and corresponding first central joint 1033 and functions as a press-fit contact member after being trimmed to separate from adjacent first out lead sections, in other words, each control terminal 103 is externally terminated with a press-fit contact member 1031; while each of the first inner lead sections 1032 extends inwards of the lead frame 101 from the corresponding first central joint 1033 and terminates at a free control contact member 1035. And each of the second outer lead sections 1041 is for example positioned between the power-side beam 1022 and corresponding second central joint 1044, while each of the second inner lead sections 1042 extends inwards of the lead frame 101 from the corresponding second central joint 1043 and terminates at a free power contact member 1045.

According to an exemplary embodiment, during manufacturing of the lead frame 101, since the control sub lead frame 1011 and the power sub lead frame 1012, which are formed by different metallic materials, are individually manufactured and subsequently joined and bonded together so as to form an integral lead frame 101, in other words, the lead frame 101 includes a bimetallic structure, generally including the control sub lead frame 1011 and the power sub lead frame 1012 which meets with the control sub lead frame 1011 at a bimetallic interface 106, as illustrated in FIG. 3. The bimetallic interface 106 is defined along all of abutting portions of the lateral beams 1023 of the control sub lead frame 1011 and the corresponding lateral beams 1024 of the power sub lead frame 1012. In a fundamental exemplary embodiment, the bimetallic interface 106 is coincident with the bonding interface, e.g., the welding interface, between the ends of lateral beams 1023, 1024 of two sub lead frames.

Figure 4:
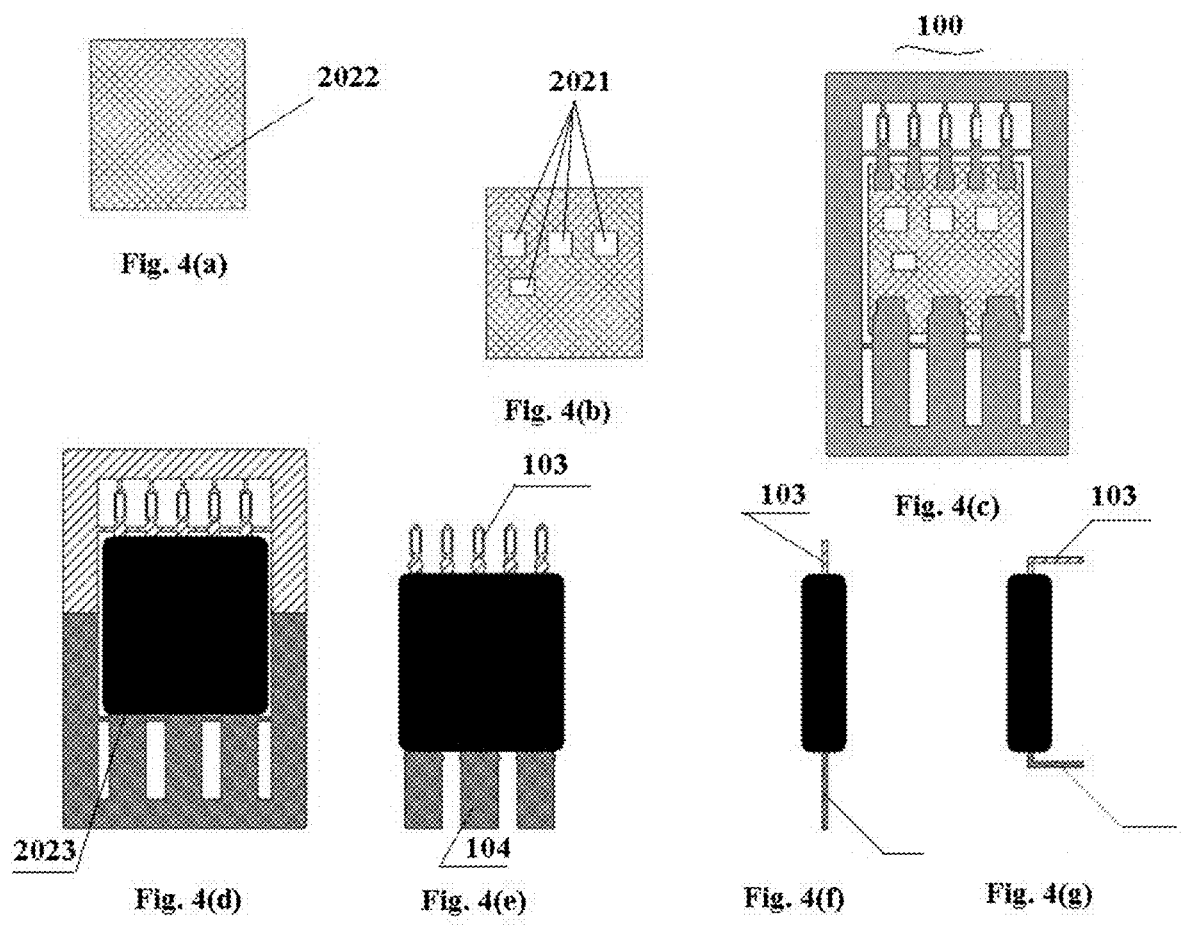
FIG. 4(a)-4(g) are schematic top views illustrating the method of attaching a semiconductor chip onto a substrate while forming individual final power terminals and control terminals, by using the exemplary lead frame in FIG. 3.

During the application of the lead frame 101, for example, FIG. 4(a)-4(g) are schematic top views illustrating the method of attaching a semiconductor chip onto a substrate while forming individual final power terminals and control terminals, by using the exemplary lead frame in FIG. 3. By way of example, before placement of the lead frame 101 and its associated power module and connections onto the substrate, firstly, some electronic components 2021 such as semiconductors, resistors, diodes, capacitors or inductors are firstly placed onto the substrate, as illustrated in FIGS. 4(a) and 4(b). Then the lead frame 101 is attached onto the substrate, with its terminals being arranged completely within an area of the substrate, as shown in FIG. 4(c). Then, additional components may be mounted and interconnections such as wire-bonds, ribbon bonds or other connection methods known in the field may be made between the components, the circuit track elements of the substrate and between the components, track elements and terminals of the lead frame. After this, as further illustrated in FIG. 4(d), a mould 2023 of the package of the power module may be directly disposed to overlap the lead frame, especially by overlapping, covering and in turn attaching/bonding to its terminals. Hereafter, a trimming process is followed, as illustrated in FIG. 4(e), to separate all of the interconnected leads/terminals, e.g., by removing all the first and second central joints 1033, 1043 while removing all the outer frame, i.e., beams 1021, 1022, 1023, 1024, of the lead frame 101. Finally, as illustrated in side cross sectional views of FIGS. 4(f), 4(g), individual leads or terminals 103, 104 may then be bent to complete the pins for connection to other outer circuits and/or components.

Likewise, on the basis of above embodiment, some variations, modifications and alterations can be realized, for example, the thickness of the different materials is essentially the same.

And as far as the combination between the two sub lead frames are concerned, an interface for combination can be exemplified in various modifications, as set forth in details hereinafter.

Bimetallic Interface Embodiment I

Figure 5A:
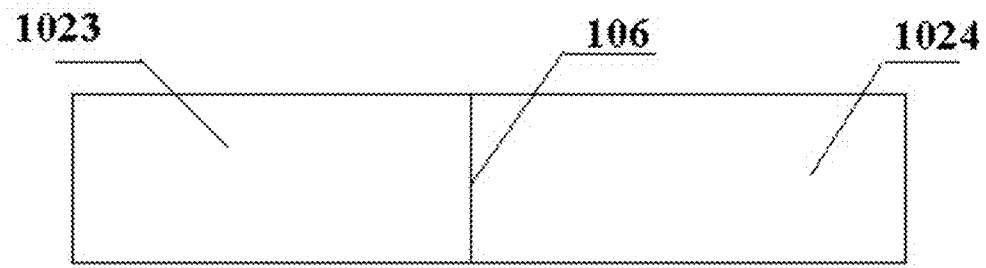
FIG. 5(a) illustrates a partially enlarged schematic cross-sectional view of the lead frame as illustrated in FIG. 3, at its bimetallic interface 106 where the power sub lead frame and the control sub lead frame are bonded directly together, according to an embodiment of the present invention.

FIG. 5(a) illustrates a partially enlarged schematic cross-sectional view of the lead frame as illustrated in FIG. 3, at its bimetallic interface 106 where the power sub lead frame 1012 and the control sub lead frame 1011 are bonded directly together, according to an embodiment of the present invention.

In an exemplary embodiment of the invention, the power sub lead frame 1012 formed by a metallic material, either a pure metal or its alloy, and the control sub lead frame 1011 which is formed by a different metallic material, are placed to abut directly and tightly against each other at ends and subsequently bonded/jointed together, e.g., by a number of available technologies including laser welding, ultrasonic welding, cladding, or use of epoxy resins, other welding means, or any other attaching means, to form the bimetallic interface 106. Hereby, the bimetallic interface 106 is defined along all abutting portions of the power sub lead frame 1012 and the control sub lead frame 1011, i.e., at the end faces of all the lateral beams 1023, 1024 thereof, and thus may be considered as being coincident with the bonding interface therebetween.

By way of the direct abutting and subsequently applied bonding/jointing methods, it may be ensured that the two sub lead frames are securely bond together to form an integral and secured lead frame with both the high conductivity property at power terminals but also high elasticity at control terminals for press-fit.

Bimetallic Interface Embodiment II

Figure 5B:
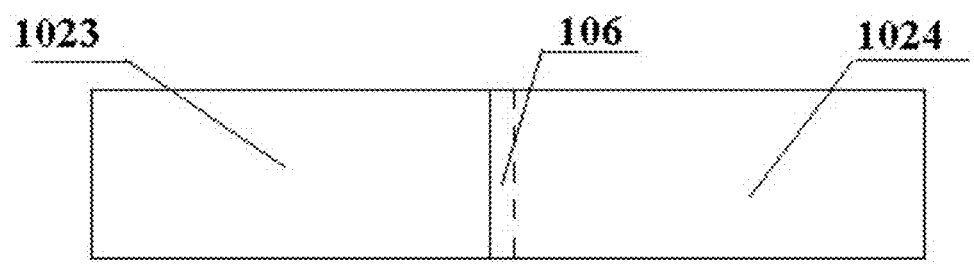
FIG. 5(b) illustrates a partially enlarged schematic cross-sectional view of the lead frame as illustrated in FIG. 3, at its bimetallic interface 106 where the power sub lead frame and the control sub lead frame are bonded together by inserting free end portions of one sub lead frame into the profiles of free end portions of another sub lead frames, according to another embodiment of the present invention.

FIG. 5(b) illustrates a partially enlarged schematic cross-sectional view of the lead frame as illustrated in FIG. 3, at its bimetallic interface 106 where the power sub lead frame 1012 and the control sub lead frame 1011 are bonded together by inserting free end portions of one sub lead frame into the profiles of free end portions of another sub lead frames, according to another embodiment of the present invention.

The lead frame of the Bimetallic Interface Embodiment II as illustrated in FIG. 5(b) only differs from that of the Bimetallic Interface Embodiment I as illustrated in FIG. 5(a) in the specific structure at the bimetallic interface.

Alternatively, in an exemplary embodiment of the invention, the aforementioned bimetallic interface as in FIG. 5(a) is formed to abut each other at ends of the lateral beams directly. In contrast, as illustrated in FIG. 5(b), along the intended bimetallic interface, the ends of the lateral beams 1023 of the control sub lead frame 1011 may be mechanically and electrically connected to the ends of the lateral beams 1024 of the power sub lead frame 1012 by cladding, or be terminated together by other processes such as by a number of available technologies including laser welding, ultrasonic welding, cladding, or use of epoxy resins, other welding means, or any other attaching means, to form the bimetallic interface 106.

In an exemplary embodiment, the ends of the lateral beams 1023 of the control sub lead frame 1011 may be formed with a pocket defined along and within the envelope or profile of such ends for receiving/accommodating therein the ends of the lateral beams 1024 of the power sub lead frame 1012. The ends of the lateral beams 1024 are inserted into the pocket and fits within the envelope or profile of the ends of the lateral beams 1023. The ends of the lateral beams 1024 are smaller as compared with the ends of the lateral beams 1023, in width and/or height, and the ends of the lateral beams 1023 extend the full scope of the ends of the lateral beams 1024, so as to define the bimetallic interface therebetween. Subsequently, the two sub lead frames 1011, 1012 are bonded/jointed together at ends of lateral beams 1023, 1024, e.g., by a number of available technologies including laser welding, ultrasonic welding, cladding, or use of epoxy resins, other welding means, or any other attaching means, to form the bimetallic interface 106. By way of example, due to the existence of pocket and the difference in width and/or height of the end of lateral beams 1023, 1024, the bimetallic interface 106 thus may be considered as being not coincident with the bonding interface therebetween. Such condition also applies when the respective structures of the ends of both pairs of lateral beams 1023, 1024 replace each other, vice versa.

By way of the provision of pocket at ends of one lateral beam for receiving corresponding ends of another opposed lateral beam, and subsequent bonding/jointing methods, it is appreciated by those skilled in the art that, the two sub lead frames fit each other positively and bond together securely, to form an integral and secured lead frame with both the high conductivity property at power terminals but also high elasticity at control terminals for press-fit.

Bimetallic Interface Embodiment III

Figure 6A:
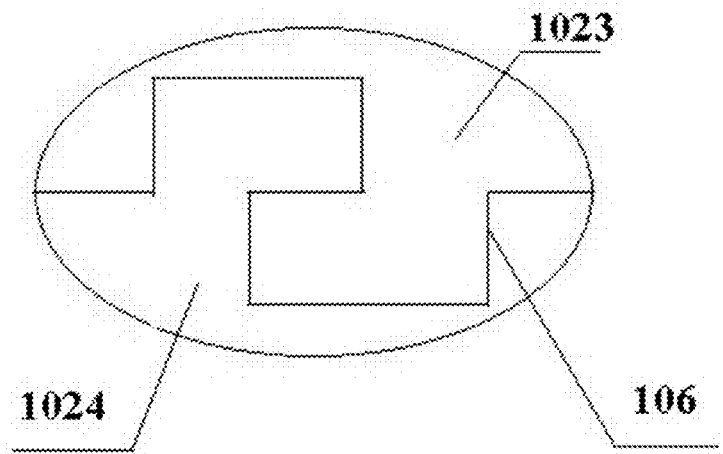
FIG. 6(a) illustrates a partially enlarged schematic top view of a bimetallic interface 106 of lead frame as illustrated in FIG. 3, where the power sub lead frame and the control sub lead frame are firstly fitted with each other positively and then bonded together, according to still another embodiment of the present invention.

FIG. 6(a) illustrates a partially enlarged schematic top view of a bimetallic interface 106 of lead frame as illustrated in FIG. 3, where the power sub lead frame 1012 and the control sub lead frame 1011 are firstly fitted with each other positively and then bonded together, according to still another embodiment of the present invention.

The lead frame of the Bimetallic Interface Embodiment III as illustrated in FIG. 6(a) only differs from those of the Bimetallic Interface Embodiments I, II and III as illustrated in FIGS. 5(a), 5(b) in the specific structure at the bimetallic interface.

In an exemplary embodiment of the invention, the power sub lead frame 1012 formed by a metallic material, either a pure metal or its alloy, and the control sub lead frame 1011 which is formed by a different metallic material, are firstly formed to be complementarily profiled at their respective ends of the corresponding lateral beams 1023, 1024 therebetween, e.g., by having respective concave/convex portions which may be complement in shape. And these two sub lead frames 1011 and 1012 are subsequently placed to fit positively at the ends of their corresponding lateral beams 1023, 1024 and to abut directly and tightly against each other at ends, so as to define a predetermined position of the bimetallic interface therebetween.

Subsequently, the two sub lead frames are bonded/jointed together along the bimetallic interface, e.g., by a number of available technologies including laser welding, ultrasonic welding, cladding, or use of epoxy resins, other welding means, or any other attaching means, to form the bimetallic interface 106. Hereby, the bimetallic interface 106 is defined along all abutting portions of the power sub lead frame 1012 and the control sub lead frame 1011, i.e., at the end faces of all the lateral beams 1023, 1024 thereof, and thus may be considered as being coincident with the bonding interface therebetween.

Through the use of both positive fit via complementarily profiled ends of corresponding lateral beams 1023, 1024 of the two sub lead frames, and the bonding/jointing methods, it may be ensured that the two sub lead frames are securely bond together to form an integral and secured lead frame with both the high conductivity property at power terminals but also high elasticity at control terminals for press-fit.

Bimetallic Interface Embodiment IV

Figure 6B:
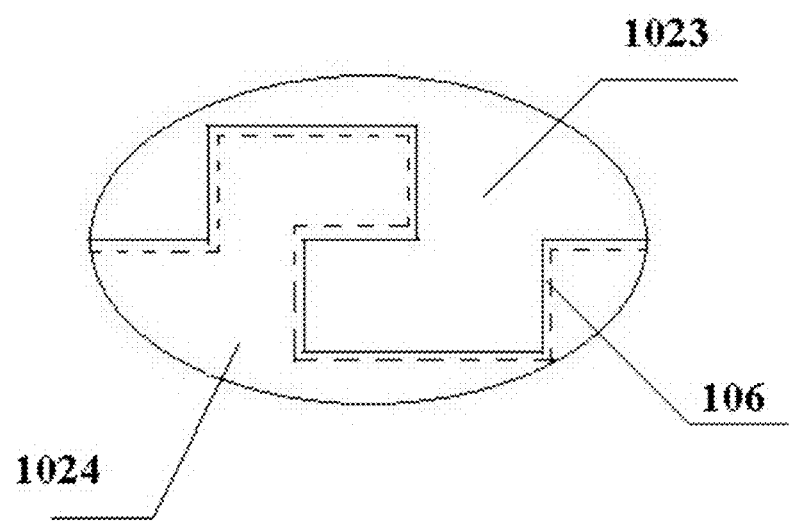
FIG. 6(b) illustrates a partially enlarged schematic top view of a bimetallic interface 106 of lead frame as illustrated in FIG. 3, where the power sub lead frame and the control sub lead frame are firstly fitted with and inserted into the profiles of each other, positively, and then bonded together, according to yet another embodiment of the present invention.

FIG. 6(b) illustrates a partially enlarged schematic top view of a bimetallic interface 106 of lead frame as illustrated in FIG. 3, where the power sub lead frame 1012 and the control sub lead frame 1011 are firstly fitted with and inserted into the profiles of each other, positively, and then bonded together, according to yet another embodiment of the present invention.

The lead frame of the Bimetallic Interface Embodiment IV as illustrated in FIG. 6(b) only differs from those of the Bimetallic Interface Embodiments I, II and III as illustrated in FIGS. 5(a), 5(b) and 6(a) in the specific structure at the bimetallic interface.

To be specific, in contrast, as illustrated in FIG. 6(b). In an exemplary embodiment of the invention, the power sub lead frame 1012 formed by a metallic material, either a pure metal or its alloy, and the control sub lead frame 1011 which is formed by a different metallic material, are firstly formed to be complementarily profiled at their respective ends of the corresponding lateral beams 1023, 1024 therebetween, e.g., by having respective concave/convex portions which may be complement in shape. And these two sub lead frames 1011 and 1012 are subsequently placed to fit positively at the ends of their corresponding lateral beams 1023, 1024 and to abut directly and tightly against each other at ends, so as to define a predetermined position of the bimetallic interface therebetween.

Meanwhile, along the intended bimetallic interface, the ends of the lateral beams 1023 of the control sub lead frame 1011 may be mechanically and electrically connected to the ends of the lateral beams 1024 of the power sub lead frame 1012 by cladding, or be terminated together by other processes such as by a number of available technologies including laser welding, ultrasonic welding, cladding, or use of epoxy resins, other welding means, or any other attaching means, to form the bimetallic interface 106.

In an exemplary embodiment, the ends of the lateral beams 1023 of the control sub lead frame 1011 may be formed with a pocket defined along and within the envelope or profile of such ends for receiving/accommodating therein the ends of the lateral beams 1024 of the power sub lead frame 1012. The ends of the lateral beams 1024 are inserted into the pocket and fits within the envelope or profile of the ends of the lateral beams 1023. The ends of the lateral beams 1024 are smaller as compared with the ends of the lateral beams 1023, in width and/or height, and the ends of the lateral beams 1023 extend the full scope of the ends of the lateral beams 1024, so as to define the bimetallic interface therebetween. Subsequently, the two sub lead frames 1011, 1012 are bonded/jointed together at ends of lateral beams 1023, 1024, e.g., by a number of available technologies including laser welding, ultrasonic welding, cladding, or use of epoxy resins, other welding means, or any other attaching means, to form the bimetallic interface 106. By way of example, due to the existence of pocket and the difference in width and/or height of the end of lateral beams 1023, 1024, the bimetallic interface 106 thus may be considered as being not coincident with the bonding interface therebetween. Such condition also applies when the respective structures of the ends of both pairs of lateral beams 1023, 1024 replace each other, vice versa.

By way of the provision of not only positive fit via complementarily profiled concave/convex shape at ends of corresponding lateral beams 1023, 1024 of the two sub lead frames, but also pocket at ends of one lateral beam for receiving corresponding ends of another opposed lateral beam, and subsequent bonding/jointing methods, it may be ensured that the two sub lead frames fit each other positively and bond together securely, to form an integral and secured lead frame with both the high conductivity property at power terminals but also high elasticity at control terminals for press-fit.

Figure 7:
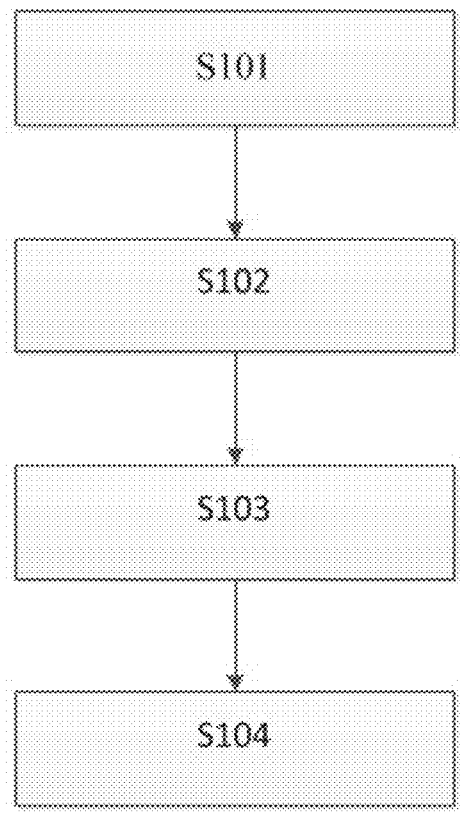
FIG. 7 illustrates a flow chart of a method for fabricating an exemplary lead frame by two different metallic materials.

FIG. 7 illustrates a flow chart of a method for fabricating an exemplary lead frame by two different metallic materials.

According to another aspect of the exemplary embodiment of the present invention, as illustrated in FIG. 7, a method for fabricating the lead frame is also provided, comprising:

Step S101: manufacturing a control sub lead frame and a power sub lead frame individually and separately;

Step S102: forming one or more power terminals 103 within the power sub lead frame and one or more control terminals 104 within the control sub lead frame, individually;

Step S103: terminating at least one of the control terminals 103 externally with a press-fit contact member 1031; and Step S104: abutting, fitting and bonding/jointing the two sub lead frames together to form a secured bimetallic interface therebetween, so as to form an integral lead frame 101.

Further Embodiment

Figure 8:
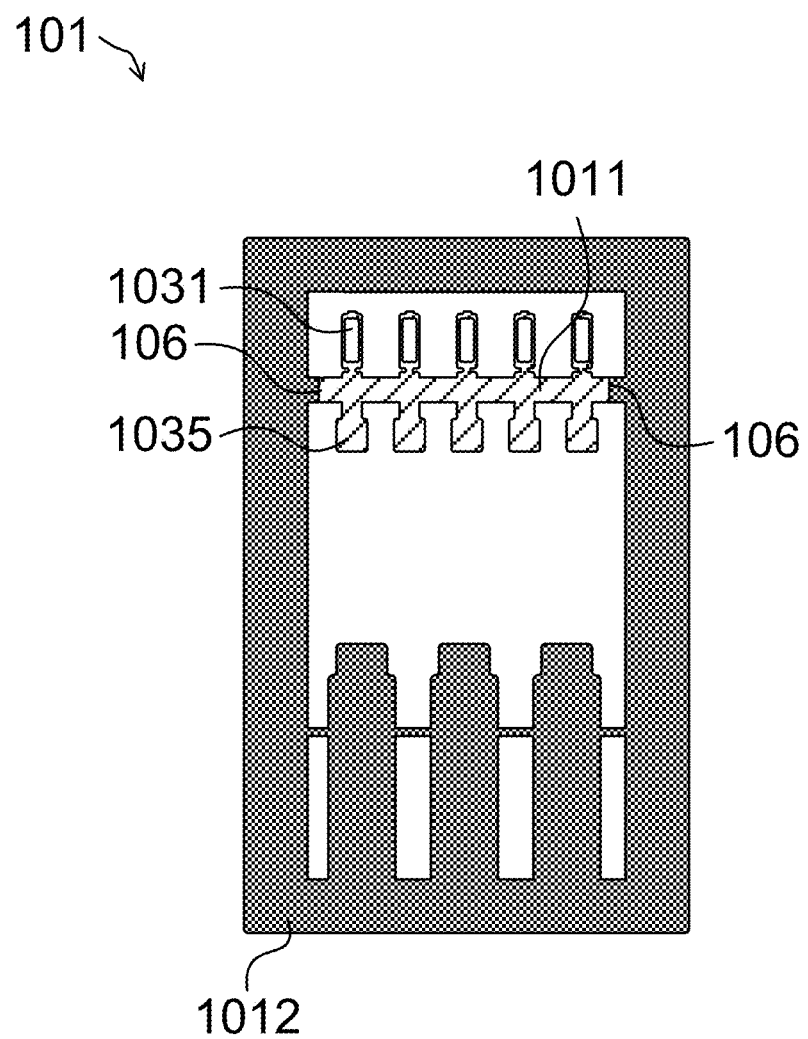
FIG. 8 is a schematic top view of a further exemplary lead frame with a power sub lead frame and a control sub lead frame which are formed by different metallic.

FIG. 8 is a schematic top view of an exemplary lead frame with a power sub lead frame and a control sub lead frame which are formed by different metallic materials in a further embodiment of the invention, before placing onto a substrate of a power electronic device;

In this embodiment, the control sub lead frame is confined to the immediate area around the sections of the sub lead frame that will form the press-fit contacts. Such an embodiment illustrates the idea that small sections of the full lead frame may be constructed from different materials, rather than the lead frame being divided roughly in half, with one half comprising one material and the other half comprising another. It will also be obvious that there can be more than two separate material sections used in the final lead frame. Two, three, four or more separate sub lead frames comprising different materials can be connected together to form the final lead frame. In this way, very precise materials can be used where required in the manner described above.

In conclusion, due to aforementioned exemplary embodiment of a lead frame with both a control sub lead frame and a power sub lead frame which are formed by different metallic materials, one with a high current conductivity and the other with a certain elasticity property, as well as the unique structure at bonding surfaces of the two sub lead frames via bimetallic interface, a novel and advantageous lead-frame, and a method for fabricating the same are provided, having some advantageous technical effects, as below: firstly, the use of different materials for different pin types helps to tailor the properties like high tensile strength for the press-fit type signal terminals or control terminals and high current carrying capability and electrical conductivity property for the power terminals, therefore the lead-frame material may not necessarily be any one specific alloy material which has to make compromise between electrical resistance and mechanical strength. Secondly, in the power terminals, low material cross sections can be realized because of the better electrical conductivity as compared with alloys with higher mechanical strengths; meanwhile, a minimized dimensional difference between the power terminals and the control or signal terminals may advantageously balance between the power terminals and the control or signal terminals the distribution of not only internal stresses but also any external forces applied thereon, respectively. Thirdly, several different plating processes could also be incorporated during fabrication of a lead-frame as a function of the individual needs of the different pin types, without the need of masks in the plating process. Finally, since such lead-frame can be achieved e.g. by combining at least two or more sub-lead frames to one part so that only one assembled lead frame has to be processed same as parts made of prior art, hereby, an advantage of this can be obtained such that the molding, trimming, and pin-forming processes still remain the same as that of the conventional lead-frame processing.

Although the disclosure is described in view of the attached drawings, the embodiments disclosed in the drawings are only intended to illustrate the preferable embodiment of the present invention exemplarily, and should not be deemed as a restriction thereof.

Various embodiments of the present invention have been illustrated progressively, the same or similar parts of which can be referred to each other. The differences between each embodiment and the others are emphatically described.

It should be noted that the terms, such as "comprising", "including" or "having", should be understood as not excluding other elements or steps and the word "a" or "an" should be understood as not excluding plural of said elements or steps. Further, any reference number in claims should be understood as not limiting the scope of the present invention.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments of the general concept of the present invention have been shown and described, it would be appreciated by those skilled in the art that various changes or modifications may be made in these embodiments without departing from the principles and spirit of the disclosure, the scope of which is defined in the claims and their equivalents.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A lead frame for placement on a substrate, the lead frame comprising, prior to placement on the substrate:
    a power sub lead frame including one or more power terminals; and
    a control sub lead frame including one or more control terminals;
    wherein at least one of the one or more control terminals is externally terminated with a press-fit contact member; and
    wherein the power sub lead frame is formed of a first material;
    wherein the control sub lead frame is formed of a second material;
    wherein the first material is a different material than the second material; and
    wherein the power sub lead frame and the control sub lead frame are secured together at a bimetallic interface.

2. The lead frame according to claim 1, further comprising:
    the power sub lead frame comprising the first material with high current conductivity; and
    the control sub lead frame comprising the second material with elasticity for making press-fit type terminals thereof.

* * * * *